US 8,823,322 B2

(12) United States Patent
Noda et al.

(10) Patent No.: US 8,823,322 B2
(45) Date of Patent: Sep. 2, 2014

(54) BATTERY PACK

(75) Inventors: Masafumi Noda, Anjo (JP); Hiroki Uesugi, Anjo (JP); Hidekazu Hayashi, Anjo (JP)

(73) Assignee: Makita Corporation, Anjo-Shi (JP)

( * ) Notice: Subject to any disclaimer, the term of this patent is extended or adjusted under 35 U.S.C. 154(b) by 412 days.

(21) Appl. No.: 13/271,516

(22) Filed: Oct. 12, 2011

(65) Prior Publication Data

US 2012/0096298 A1   Apr. 19, 2012

(30) Foreign Application Priority Data

Oct. 15, 2010   (JP) ................. 2010-232540

(51) Int. Cl.
*H02J 7/00*      (2006.01)
*H01M 10/42*    (2006.01)
*H01M 10/44*    (2006.01)
*H01M 10/48*    (2006.01)
*G01R 31/36*    (2006.01)
*H01M 10/0525*  (2010.01)

(52) U.S. Cl.
CPC .......... *H02J 7/0021* (2013.01); *G01R 31/3658* (2013.01); *H01M 10/4257* (2013.01); *H01M 10/0525* (2013.01); *H02J 7/0029* (2013.01); *H01M 10/441* (2013.01); *Y02E 60/12* (2013.01); *H01M 10/448* (2013.01); *G01R 31/3606* (2013.01); *H01M 10/482* (2013.01); *H02J 7/0072* (2013.01)
USPC ............................ 320/116; 320/134; 320/136

(58) Field of Classification Search
CPC ............ G01R 31/3658; G01R 31/3606; H02J 7/0021; H01M 10/48
USPC .......................................... 320/116, 134, 136
See application file for complete search history.

(56) References Cited

U.S. PATENT DOCUMENTS 4,553,081 A * 11/1985 Koenck ......................... 320/131
5,631,537 A *  5/1997 Armstrong ..................... 320/118

(Continued)

FOREIGN PATENT DOCUMENTS

EP    1 884 790 A1    2/2008
EP    1 892 812 A2    2/2008

(Continued)

OTHER PUBLICATIONS

Jan. 30, 2012 Search Report issued in European Patent Application No. 11185014.5.

(Continued)

*Primary Examiner* — M'Baye Diao
(74) *Attorney, Agent, or Firm* — Oliff PLC

(57) ABSTRACT

A tool battery pack can include a current detection element for detecting a discharge current or a charge current, a monitoring section for inputting a current signal of the discharge current or the charge current through the current detection element and for inputting voltage signals of each cell battery, and a control microcomputer for performing discharge control or charge control based on the signals from the monitoring section. Further, the tool battery pack is constructed such that the current signal through the current detection element is input to both the monitoring section and the control microcomputer.

4 Claims, 6 Drawing Sheets

(56) References Cited

U.S. PATENT DOCUMENTS

| | | | |
|---|---|---|---|
| 5,903,131 A * | 5/1999 | Sekine et al. | 320/106 |
| 6,064,179 A * | 5/2000 | Ito et al. | 320/128 |
| 6,265,848 B1 * | 7/2001 | Mukainakano | 320/132 |
| 7,248,020 B2 * | 7/2007 | Hidaka et al. | 320/134 |
| 7,511,457 B2 * | 3/2009 | Emori et al. | 320/118 |
| 7,864,090 B2 * | 1/2011 | Yamamoto et al. | 341/119 |
| 2006/0012341 A1 * | 1/2006 | Burns | 320/132 |
| 2007/0029973 A1 | 2/2007 | Ashizawa et al. | |
| 2008/0180059 A1 | 7/2008 | Carrier et al. | |
| 2011/0187329 A1 | 8/2011 | Majima et al. | |

FOREIGN PATENT DOCUMENTS

| | | |
|---|---|---|
| EP | 1 975 636 A2 | 10/2008 |
| JP | A-2007-520180 | 7/2007 |
| JP | A-2009-097954 | 5/2009 |
| WO | WO 2010/029942 A1 | 3/2010 |

OTHER PUBLICATIONS

Office Action dated Feb. 5, 2014 issued in Japanese Patent Application No. 2010-232540 (with English Translation).

* cited by examiner

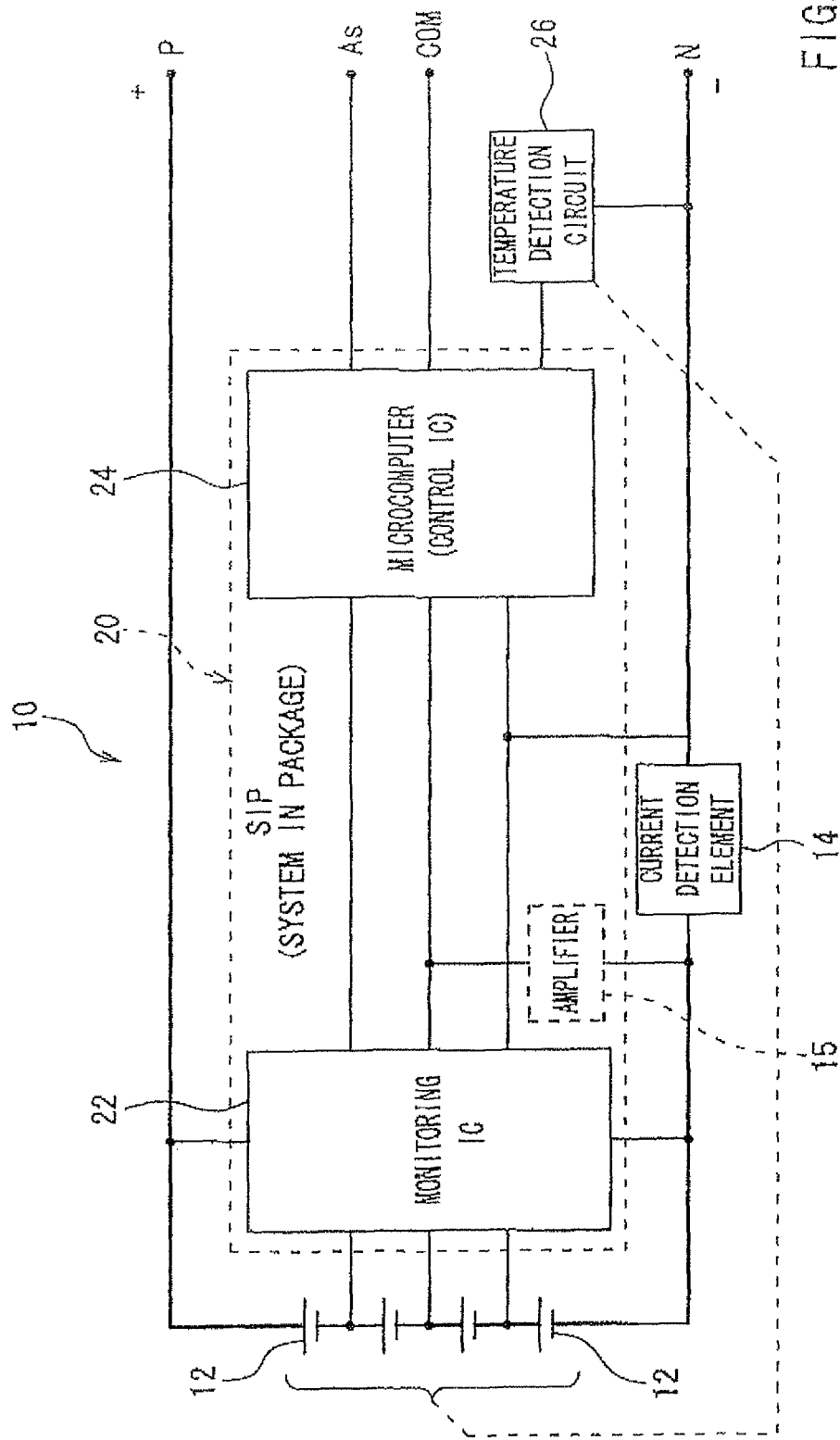
F I G. 6

BATTERY PACK

This application claims priority to Japanese patent application serial number 2010-232540, the contents of which are incorporated herein by reference.

BACKGROUND OF THE INVENTION

1. Field of the Invention

The present invention relates to a tool battery pack which includes a monitoring section for inputting current signals of discharge current or charge current and for inputting voltage signals of cell batteries, and also includes a control microcomputer for performing discharge control or charge control of the cell batteries based on signals from the monitoring section.

2. Description of the Related Art

An existing tool battery pack relating to the above invention is described in Japanese Laid-Open Patent Publication No. 2009-097954.

The battery pack described in Japanese Laid-Open Patent Publication No. 2009-097954 is constructed such that discharge current or charge current is converted to a voltage signal by a shunt resistance and then the signal is input to a monitoring section. Further, the monitoring section is constructed to input voltage signal of each cell battery. The monitoring section transmits data of the discharge current or the charge current and also data of the voltage of each cell battery to a control microcomputer. The control microcomputer is constructed to perform discharge control or charge control based on the data transmitted from the monitoring section.

In the battery pack described above, the signal of discharge current or charge current is input to the monitoring section, and then the signal is transmitted to the control microcomputer through the monitoring section. Consequently, in case a failure of the monitoring section occurs and abnormal current flows, the failure of the monitoring section may not be detected unless the current value exceeds a normal range to a great extent. Therefore, the control microcomputer may perform discharge control or charge control based on erroneous current data, which causes damages of the cell batteries etc.

Further, even if abnormality of current is detected, it may be difficult to judge whether a failure of the monitoring section or the shunt resistance causes an abnormal current flow.

Thus, there is a need in the art to correctly judge a failure of the current detection element and the monitoring section of the tool battery.

SUMMARY OF THE INVENTION

One construction for a tool battery pack can include a current detection element for detecting a discharge current or a charge current, a monitoring section for inputting a current signal of the discharge current or the charge current through the current detection element and for inputting voltage signals of each cell battery, and a control microcomputer for performing discharge control or charge control based on the signals from the monitoring section, and is characterized in that the current signal through the current detection element is input to both the monitoring section and the control microcomputer.

According to this construction, the current signal through the current detection element are constructed to be input to both the monitoring section and the control microcomputer. Therefore, if a failure of the monitoring section occurs, the current signal transmitted from the monitoring section to the control microcomputer differs greatly from the current signal input to the control microcomputer. Consequently, the control microcomputer can detect the failure of the monitoring section correctly and promptly.

Further, in case a failure of the current detection element or a current detection circuit occurs, abnormal current can be detected in both the monitoring section and the control microcomputer, and thus the failure of the current detection element etc. can be judged correctly.

According to another construction, the monitoring section is constructed to transmit current signals of the discharge current or the charge current to the control microcomputer by way of communication.

Consequently, the control microcomputer can always compare the current signal transmitted from the monitoring section to the control microcomputer with the current signal input from the current detection element to the control microcomputer.

According to another construction, when a difference between the discharge current signal transmitted from the monitoring section to the control microcomputer and the discharge current signal the control microcomputer acquires from the current detection element exceeds a first predetermined value, the control microcomputer stores the information and stops discharging.

In this way, in case abnormality of a current flow occurs, discharging can be stopped promptly, and thus a breakdown of the tool battery pack or the tool itself can be prevented.

According to another construction, when a difference between the charge current signal transmitted from the monitoring section to the control microcomputer and the charge current signal the control microcomputer acquires from the current detection element exceeds a second predetermined value, the control microcomputer stores the information and stops charging.

In this way, in case abnormality of a current flow occurs, charging can be stopped promptly, and thus a breakdown of the tool battery pack or a battery charger itself can be prevented.

According to the above, a failure of the current detection element and the monitoring section for monitoring currents can be judged correctly and promptly in the tool battery pack.

BRIEF DESCRIPTION OF THE DRAWINGS

FIG. 6 is a circuit block diagram of the tool battery pack according to a modified example.

DETAILED DESCRIPTION OF THE INVENTION

Each of the additional features and teachings disclosed above and below may be utilized separately or in conjunction with other features and teachings to provide an improved tool battery pack. Representative examples of the present teaching, which examples utilize many of these additional features and teachings both separately and in conjunction with one another, will now be described in detail with reference to the attached drawings. This detailed description is merely intended to teach a person of skill in the art further details for practicing preferred aspects of the present teachings and is not intended to limit the scope of the invention. Only the claims define the scope of the claimed invention. Therefore, combinations of features and steps disclosed in the following detailed description may not be necessary to practice the invention in the broadest sense, and are instead taught merely to particularly describe representative examples of the invention. Moreover, various features of the representative examples and the dependent claims may be combined in ways that are not specifically enumerated in order to provide additional useful examples of the present teachings.

A tool battery pack 10 according to an example will be described below with references to FIG. 1 to FIG. 6. The tool battery pack 10 is connected to an electric power tool (not shown) and serves as a power source for the electric power tool. Further, the tool battery pack 10 can be recharged by a battery charger (not shown).

Figure 1:
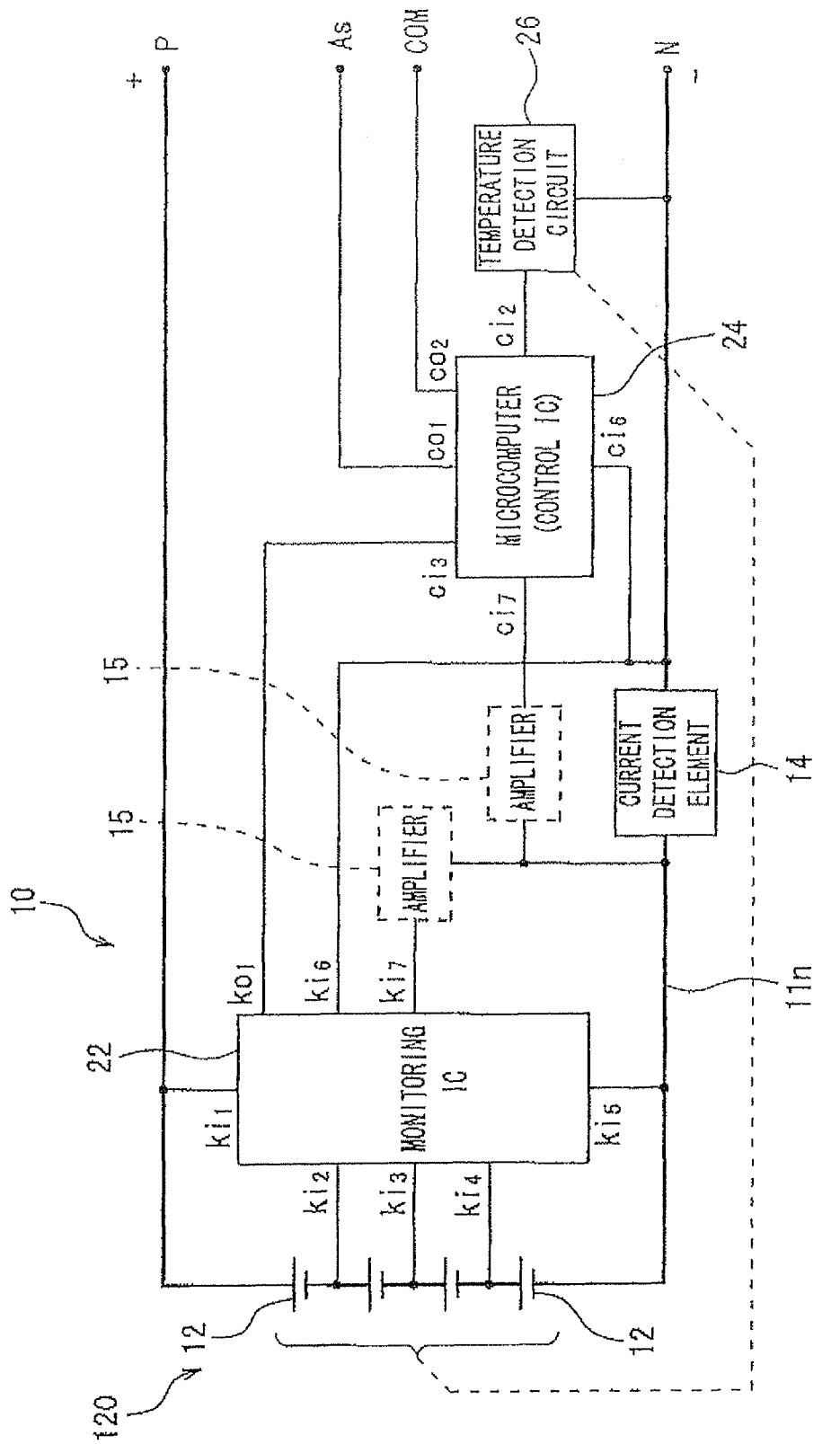
FIG. 1 is a circuit block diagram of a tool battery pack according to one example.

As shown in FIG. 1, the tool battery pack 10 includes a plurality of cells 12 which are secondary cells such as lithium-ion cells, and a predetermined voltage value is obtained by connection the cells 12 in series. A positive electrode side of an assembly of cells 12 connected in series (cell assembly 120) is connected to a positive terminal P of the tool battery pack 10. Further, a negative electrode side of the cell assembly 120 is connected to a negative terminal N of the tool battery pack 10. Further, a shunt resistance 14 is provided in a negative line $11n$ located between the negative electrode of the cell assembly 120 and the negative terminal N of the tool battery pack 10.

The resistance value of the shunt resistance 14 is set to very small in order to suppress a voltage drop. Consequently, a current signal of the discharge current or the charge current can be detected in the form of a converted minute voltage signal. The tool battery pack 10 is provided with amplifies 15, and the minute voltage signal can be amplified to a predetermined voltage level. The amplified voltage signals are input to both a monitoring section 22 and a control microcomputer 24, as will be described later. Hereinafter, the voltage signals amplified by the amplifier 15 are referred to as discharge current signals or charge current signals.

Further, the cell assembly 120 is provided with a thermister (not shown) for detecting cell 12 temperatures. A signal of the thermister is converted to a voltage signal in a temperature detection circuit 26, and the voltage signal is input to the control microcomputer 24, as will be described later.

The tool battery pack 10 is provided with the monitoring section 22, the control microcomputer 24, and the temperature detection circuit 26.

The monitoring section 22 corresponds to an IC that measures voltages of each cell 12 and also measures a discharge current or a charge current, and transmits the measured data to the control microcomputer 24. As shown in FIG. 1, the monitoring section 22 is provided with input terminals ki 1 to ki 5 for inputting voltages of each cell 12, input terminals ki 6 and ki 7 for inputting the discharge current or the charge current, and an output terminal ko 1 for transmitting data to the control microcomputer 24.

The control microcomputer 24 is a microcomputer for performing discharge control or charge control as will be described later, based on the voltage data of each cell 12 transmitted from the monitoring section 22, data of discharge current or charge current, and temperature data of the cells 12. Further, the control microcomputer 24 is constructed such that a failure of the shunt resistance 14, the amplifiers 15, and the monitoring section 22 be detected. As shown in FIG. 1, the control microcomputer 24 is provided with an input terminal ci 3 for inputting data transmitted from the monitoring section 22, input terminals ci 6 and ci 7 for inputting the discharge current signal or the charge current signal, and an input terminal ci 2 for inputting temperature signal from the temperature detection circuit 26. In this way, the discharge current signals or the charge current signals are input to both the control microcomputer 24 and the monitoring section 22.

Further, the control microcomputer 24 is provided with an output terminal co 1 for outputting a drive-stop signal to the electric power tool, and a communication terminal co 2 for communicating with the battery charger. The output terminal co 1 of the control microcomputer 24 is connected to an auto-stop terminal AS of the tool battery pack 10, and the communication terminal co 2 is connected to a communication terminal COM of the tool battery pack 10.

Figure 2:
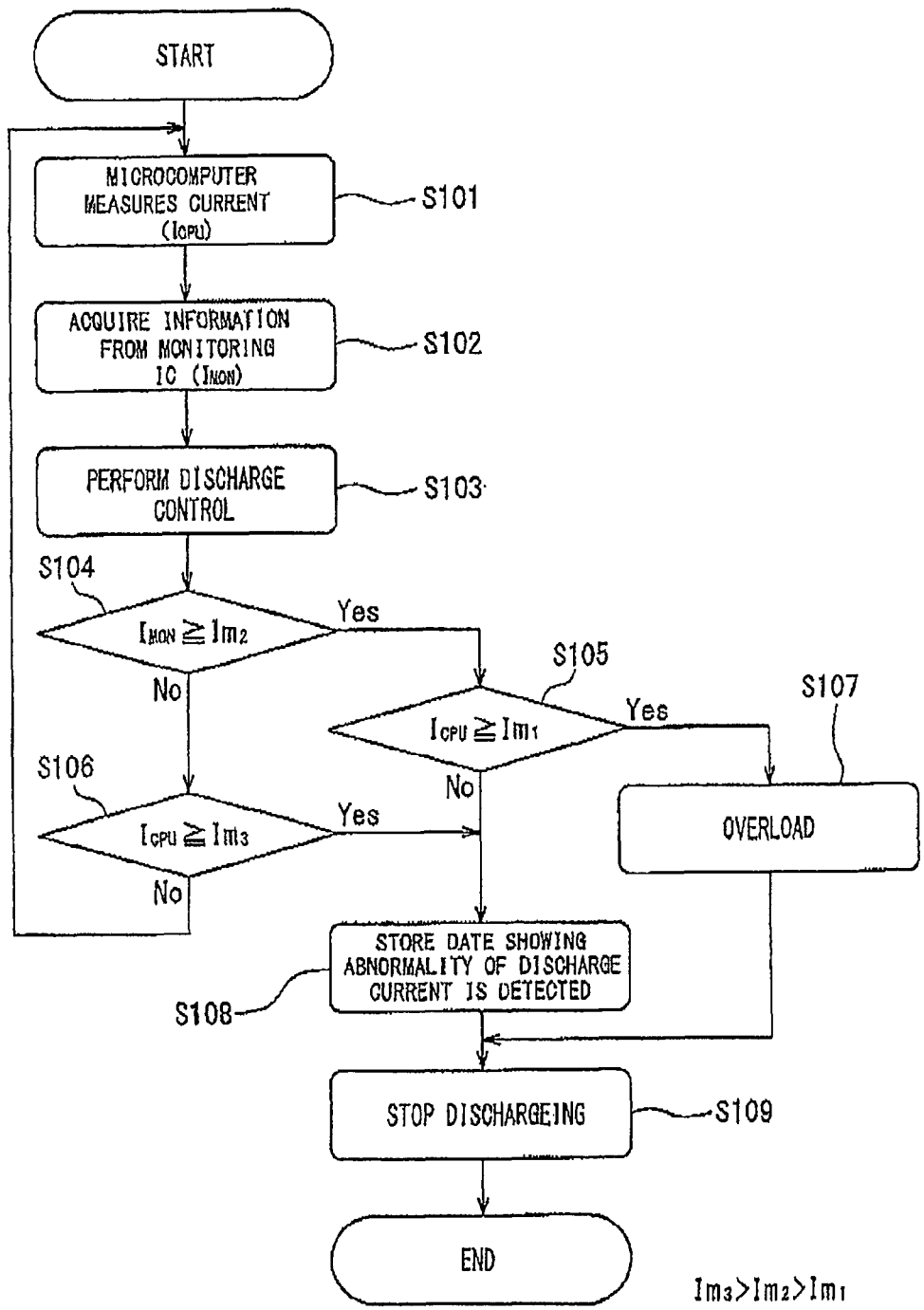
FIG. 2 is a flowchart showing a sequence of discharge actions of the tool battery pack.
Figure 3:
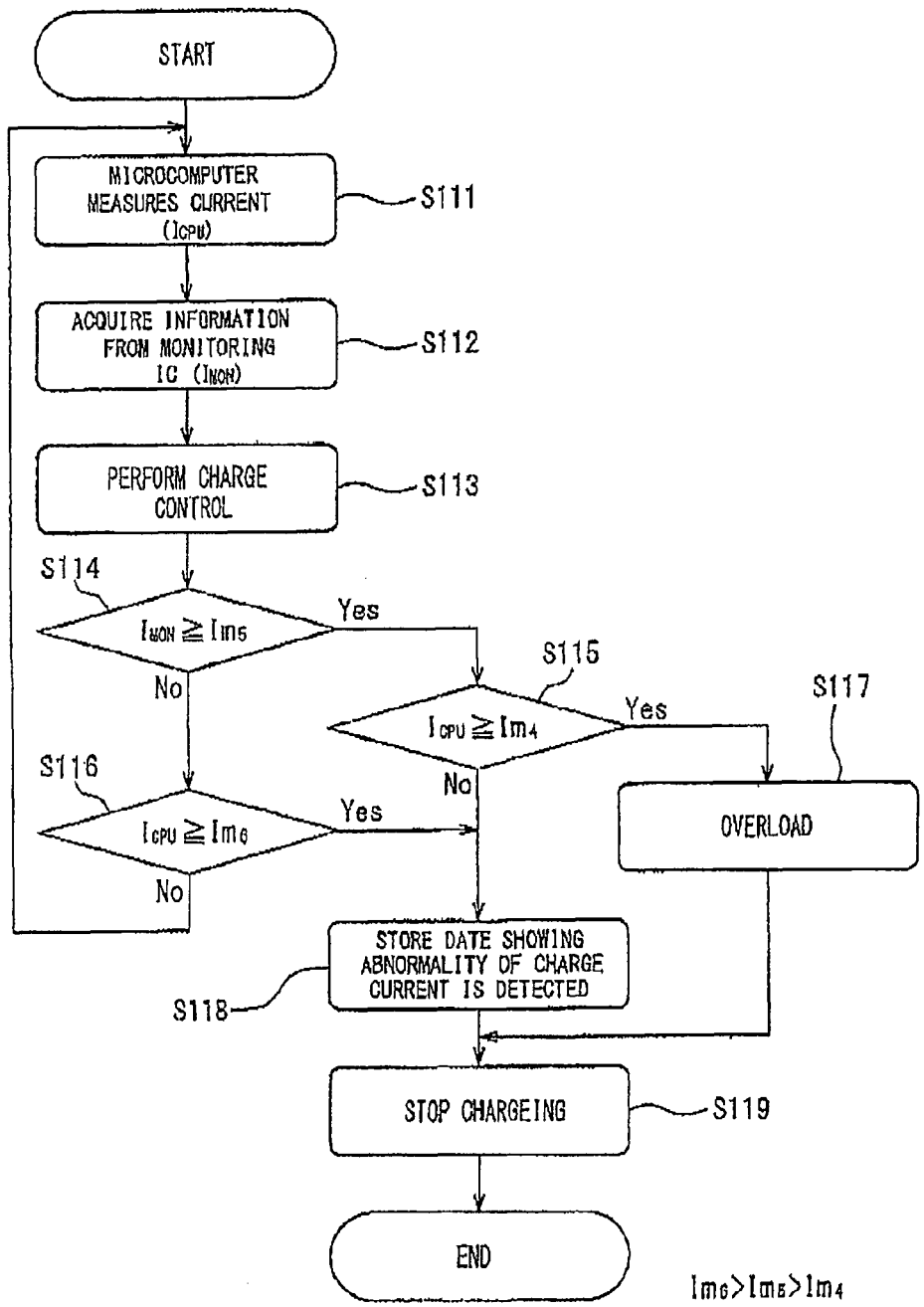
FIG. 3 is a flowchart showing a sequence of charge actions of the tool battery pack.

Next, a sequence of actions of the tool battery pack 10 will be described below with references to FIG. 2 and FIG. 3. A program for performing each action of the flowcharts in FIG. 2 and FIG. 3 is stored in a memory (not shown) of the control microcomputer 24.

First, a sequence of discharge actions of the tool battery pack 10 will be described below. At the time of discharging, the tool battery pack 10 is connected to the electric power tool, and the positive terminal P and the negative terminal N of the tool battery pack 10 are connected to the positive terminal and the negative terminal of the electric power tool, respectively. Further, the auto-stop terminal AS of the tool battery is connected to an auto-stop terminal of the electric power tool, and the communication terminal COM of the tool battery pack 10 is kept to be an open state (a flowing state).

In the memory of the control microcomputer 24, a first upper limit Im1, a second upper limit Im2, and a third upper limit Im3 are stored, and the relationship between these limits are set to be Im3>Im2>Im1.

When the tool battery pack 10 is connected to the electric power tool, the tool battery pack 10 becomes to be dischargeable, and monitoring a discharge current is started. In step S101, the discharge current signal, which is obtained through the shunt resistance 14 and the amplifier 15, is input to the control microcomputer 24, and the data is stored as a discharge current data Icpu. Next, the discharge current signal is also input to the monitoring section 22 and the data is stored as a discharge current data Imon, and then the discharge current data Imon is transmitted to the control microcomputer 24 (step S102). Further, voltage signals of each cell 12 and temperature signals of cells 12 are input to the control microcomputer 24, and these data are stored, and then discharge control is performed by the control microcomputer 24 (step S103). In step S103, the control microcomputer 24 performs the monitoring of the cells 12 based on the voltage data of each cell 12, discharge current data and the temperature data of cells 12, and if a remaining capacity of the cells 12 falls below a predetermined value or the discharge current signal exceeds a predetermined value, or the temperatures of the cells 12 exceeds a predetermined value, the control microcomputer 24 outputs a signal for stopping discharging.

Next, the control microcomputer 24 judges whether the discharge current data Imon transmitted from the monitoring section 22 to the control microcomputer 24 exceeds the second upper limit Im2 or not (step S104). That is, based on the discharge current data Imon of the monitoring section 22, an overload judgment of the tool battery pack 10 can be performed. When it is judged that an overload does not occur (step S014, NO), another overload judgment is performed based on the discharge current data Icpu stored in the control microcomputer 24 (step S106). That is, the control microcomputer 24 judges whether the discharge current data Icpu exceeds the third upper limit Im3 or not (step S106). When it is judged that another overload does not occur (step S106, NO), the procedure is returned to step S101.

In this way, when it is judged that the overload judgments do not occur and the monitoring section 22, the shunt resistance 14, and the amplifiers 15 operate properly, the steps S101 to S104, and the step S106 are conducted at a fixed time interval repeatedly until a remaining capacity of cells 12 falls below a predetermined value or the temperatures of the cells 12 exceeds a predetermined value.

When it is judged that the overload does not occur based on the discharge current data Imon of the monitoring section 22 (Imon<Im2, step S104 NO) and the another overload occurs based on the discharge current data Icpu of the control microcomputer 24 (Icpu≥Im3, step S106, YES), the data showing abnormality of discharge current has been detected is stored in step S108. In this case, it is judged that the discharge current data Imon of the monitoring section 22 is smaller than the second upper limit Im2 and the discharge current data Icpu of the control microcomputer 24 is larger than the third upper limit Im3. As described above, the third upper limit Im3 is set to be larger than the second upper limit Im2 (Im3>Im2). Consequently, from the above judgment, the value of the discharge current data Icpu of the control microcomputer 24 subtracted by the discharge current data Imon of the monitoring section 22 is larger than the value of the third upper limit Im3 subtracted by the second upper limit Im2 (Icpu−Imon>Im3−Im2). Under normal conditions, Icpu should be equal to Imon. However, the difference between Icpu and linen is larger than the difference between Im3 and Im2 in this case, and thus it is contemplated that a failure of the monitoring section 22 has occurred.

In this example, the value of Im3 subtracted by Im2 (Im3−Im2) corresponds to a first defined value. In this case, after the data showing the abnormality of discharge current has been detected is stored in step S108, the control microcomputer 24 outputs a signal for stopping discharging to the electric power tool, causing the electric power tool to stop. After that, discharge and charge are prohibited. Since this condition is stored in a nonvolatile memory such as an EEPROM, the discharge and charge prohibit state can be maintained almost indefinitely.

When it is judged that the overload occurs based on the discharge current data Imon of the monitoring section 22 (Imon≥Im2, step S104 YES) and the another overload does not occur based on the discharge current data Icpu of the control microcomputer 24 (Icpu<Im1, step S105 NO), the data showing abnormality of discharge current has been detected is stored in step S108 and the control microcomputer 24 outputs a signal for stopping discharging to the electric power tool, causing the electric power tool to stop (step S109).

As described above, the second upper limit Im2 is set to be larger than the first upper limit Im1 (Im2>Im1). Consequently, from the above judgment, the value of the discharge Current data Imon of the monitoring section 22 subtracted by the discharge current data Icpu of the control microcomputer 24 is larger than the value of the second upper limit Im2 subtracted by the first upper limit Im1 (Imon−Icpu>Im2−Im1). Under normal conditions, Icpu should be equal to Imon. However, the difference between Icpu and Imon is larger than the difference between Im2 and Im1 in this case, and thus it is contemplated that a failure of the monitoring section 22 has occurred.

In this example, the value of Im2 subtracted by Im1 (Im2−Im1) corresponds to the first defined value as well.

Further, when it is judged that the overload based on the discharge current data Imon of the monitoring section 22 occurs (step S104 YES) and also the another overload based on the discharge current data Icpu of the control microcomputer 24 occurs (step S105 YES), the overload really occurs, and consequently the control microcomputer 24 outputs a signal for stopping discharging to the electric power tool, causing the electric power tool to stop (step S107, step S109).

In case a failure of the amplifiers 15, the monitoring section 22, or the control microcomputer 24 occurs, both the discharge current data Imon of the monitoring section 22 and the discharge current data Icpu of the control microcomputer 24 will be abnormal values, and thus a judgment of abnormality can be made.

Next, a sequence of charge actions of the tool battery pack 10 will be described with reference to FIG. 3. At the time of charging, the tool battery pack 10 is connected to the battery charger, and the positive terminal P and the negative terminal N of the tool battery pack 10 are connected to a positive terminal and a negative terminal of the battery charger, respectively. Further, the communication terminal COM of the tool battery pack 10 is connected to a communication terminal of the battery charger, and the auto-stop terminal AS of the tool battery pack 10 is pulled up to a control voltage (for example, 5V) through a pull-up resister within the battery charger and is connected to a CPU of the battery charger. Further, in case there is nonconformity between the information from the communication terminal COM and from the auto-stop terminal AS during charging, a program stored in the battery charger stops charging.

Further, a first upper limit Im4, a second upper limit Im5, and a third upper limit Im6 for the battery charger are stored in the memory of the control microcomputer 24, and the relationship between these limits are set to be Im6>Im5>Im4.

At the time of charging, a similar procedure is performed. The charge current data Imon of the monitoring section 22 should be equal to the charge current data Icpu of the control microcomputer 24. However, in case the value of the difference between the charge current data Imon of the monitoring section 22 and the charge current data Icpu of the control microcomputer 24 exceeds the value of Im6 subtracted by Im5 (Im6−Im5) or the value of Im5 subtracted by Im4 (Im5−Im4), it is judged that abnormality of charge current has been detected.

The data showing that abnormality of the charge current data has been detected is stored in the nonvolatile memory such as an EEPROM, and after that charge and discharge prohibit state can be maintained almost indefinitely.

In the example, the value of Im6 subtracted by Im5 (Im6−Im5) or the value of Im5 subtracted by Im4 (Im5−Im4) corresponds to the second defined value.

According to the tool battery pack 10 of the example, the current signal from the current detection element (the shunt resistance 14 etc.) is input to both the monitoring section 22 and the control microcomputer 24. Consequently, in case a failure of the monitoring section 22 occurs, the difference between the current signal transmitted from the monitoring section 22 to the control microcomputer 24 and the current signal input from the shunt resister 14 to the microcomputer 24 becomes large, and thus the control microcomputer 24 can detect a failure of the monitoring section 22 easily and correctly.

Further, in such a case, charge or discharge can be prohibited promptly, and a breakdown of the tool battery pack 10, the electric power tool or the battery charger can be prohibited.

Figure 4:
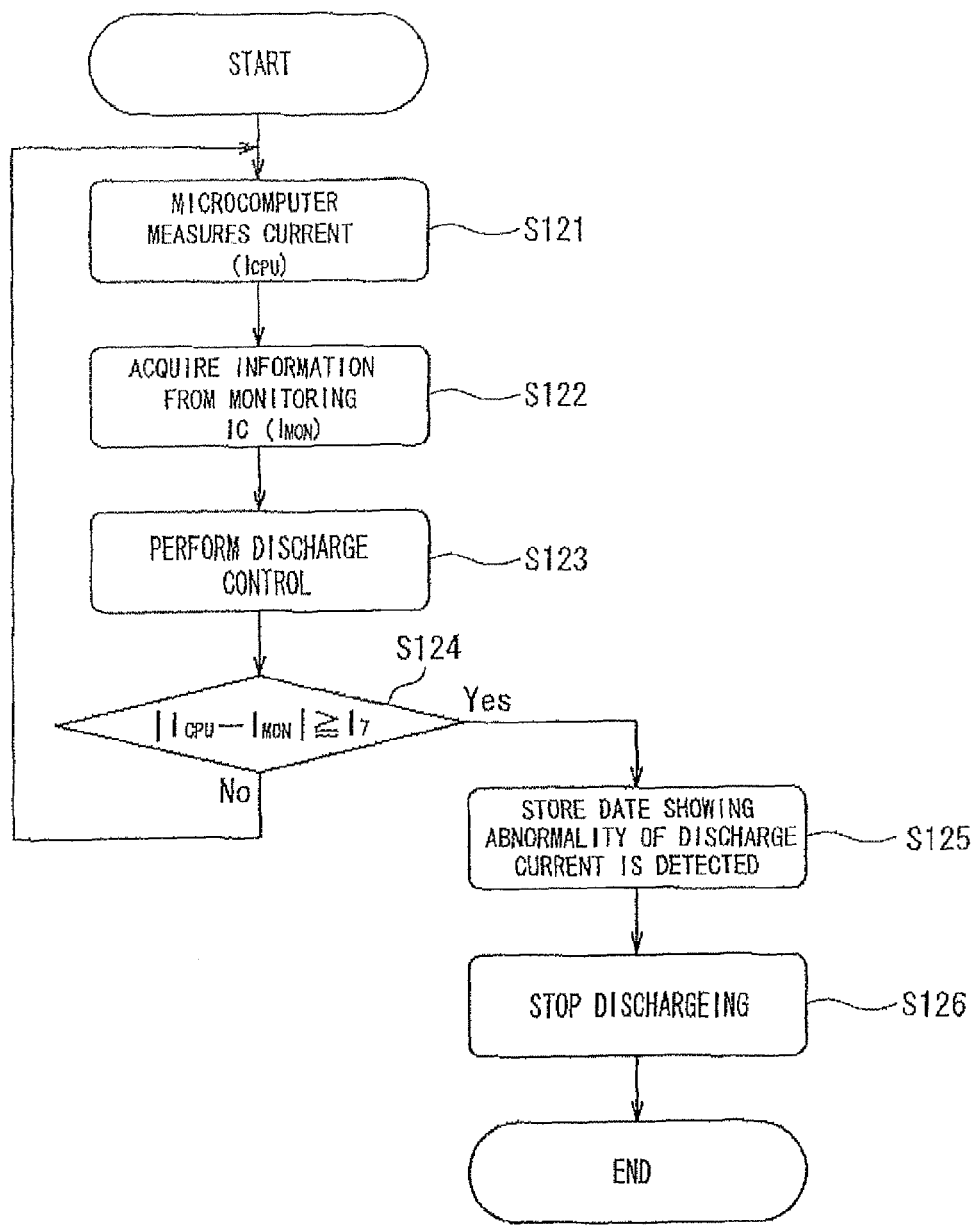
FIG. 4 is a flowchart showing a sequence of discharge actions of the tool battery pack according to a modified example.
Figure 5:
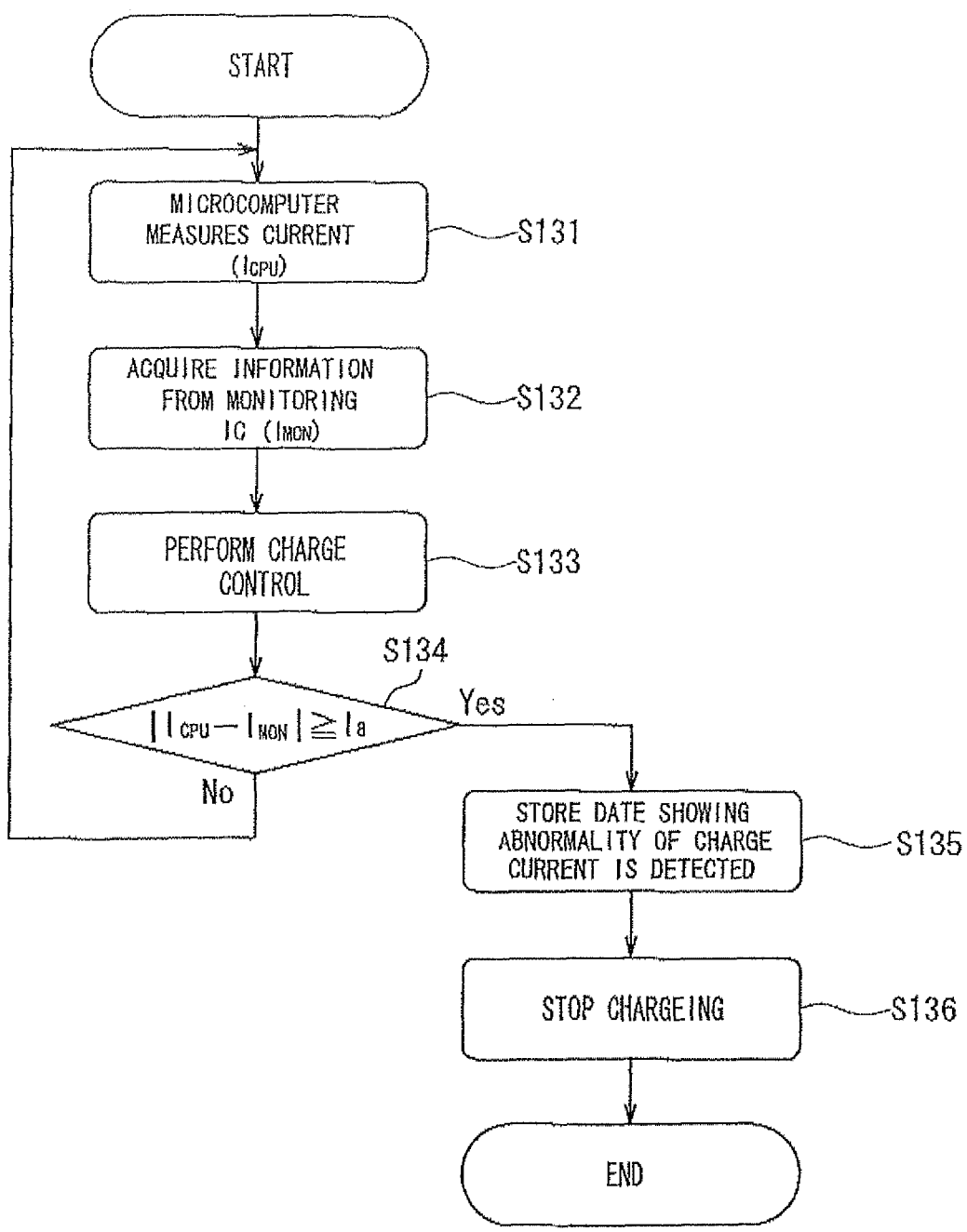
FIG. 5 is a flowchart showing a sequence of charge actions of the tool battery pack according to the modified example.

The above construction may not be limited by the above-described example and various changes may be made without departing from the scope of the invention. In the above-described example, the overload based on the discharge (charge) current data Imon of the monitoring section 22 is checked in step S104 (S114) of FIG. 2 (FIG. 3) and another overload based on the discharge (charge) current data Icpu of the control microcomputer 24 is checked for judging abnormality of discharge current in step S106 (S116) of FIG. 2 (FIG. 3). However, as shown in FIG. 4 (FIG. 5), the difference between the discharge (charge) current data Imon of the monitoring section 22 and the discharge (charge) current data Icpu of the control microcomputer 24 is calculated in step S124 (S134), and in case the absolute value of the Icpu subtracted by the Imon (|Icpu−Imon|) exceeds an acceptable value I7 (I8), it can be judged that abnormality of discharge (charge) current occurs.

In this case, the acceptable value I7 corresponds to the first defined value and the acceptable value I8 corresponds to the second defined value.

Further, in the above-described example, a purpose-built IC is used as the monitoring section 22, but it is possible that a microcomputer is used as the monitoring section 22. Further, in the above-identified example, the tool battery pack 10 is provided with the monitoring section 22 and the control microcomputer 24 separately, but it is possible that SIP 20 (System In Package), which is combined with functions of the monitoring section 22 and the control microcomputer 24, is used.

Further, in the above-identified example, the shunt resistance is used as the current detection element, but it is possible that on resistance of an FET can be used instead of the shunt resistance.

Further, in the above-identified example, digital signals are used for transmitting the discharge (charge) current signal Imon of the monitoring section 22 to the control microcomputer 24, but it is possible that analog signals can be used.

We claim:

1. A battery pack, comprising: a secondary cell battery;
a current detection element for detecting a discharge current flowing from the secondary cell battery or a charge current flowing to the secondary cell battery;
a monitoring section for inputting a current signal of the discharge current or the charge current through the current detection element and for inputting a voltage signal of the secondary cell battery; and
a control microcomputer for performing discharge control or charge control based on the signals from the monitoring section, wherein:
the current signal through the current detection element is input to both the monitoring section and the control microcomputer; and
when a first difference between the discharge current signal transmitted from the monitoring section to the control microcomputer and the discharge current signal the control microcomputer acquires from the current detection element exceeds a first defined value, the control microcomputer stores a data showing abnormal discharge current is detected and outputs a signal for stopping discharging; or
when a second difference between the charge current signal transmitted from the monitoring section to the control microcomputer and the charge current signal the control microcomputer acquires from the current detection element exceeds a second defined value, the control microcomputer stores a data showing abnormal charge current is detected and outputs a signal for stopping charging.

2. The battery pack according to claim 1, wherein a shunt resistance or an FET is used as the current detection element.

3. The battery pack according to claim 1, wherein a System In Package is used as the monitoring section and the control microcomputer.

4. A method for performing discharge control or charge control of a battery pack having a secondary cell battery, comprising the steps of:
detecting a discharge current or a charge current by a current detection element;
inputting a current signal of the discharge current or the charge current through the current detection element to both a monitoring section and a control microcomputer and a voltage signal of the secondary cell battery to the monitoring section;
performing discharge control or charge control based on the signals from the monitoring section by a control microcomputer; and
the step of performing discharge control comprises:
judging whether a first difference between the discharge current signal transmitted from the monitoring section to the control microcomputer and the discharge current signal the control microcomputer acquires from the current detection element exceeds a first defined value;
storing a data showing abnormal discharge current is detected when the first difference exceeds the first defined value; and
outputting a signal for stopping discharging
the step of performing discharge control comprises:
judging whether a second difference between the charge current signal transmitted from the monitoring section to the control microcomputer and the charge current signal the control microcomputer acquires from the current detection element exceeds a second defined value;
storing a data showing abnormal charge current is detected when the second difference exceeds the second defined value; and
outputting a signal for stopping charging.

* * * * *

UNITED STATES PATENT AND TRADEMARK OFFICE
CERTIFICATE OF CORRECTION

| | |
|---|---|
| PATENT NO. | : 8,823,322 B2 |
| APPLICATION NO. | : 13/271516 |
| DATED | : September 2, 2014 |
| INVENTOR(S) | : Masafumi Noda et al. |

It is certified that error appears in the above-identified patent and that said Letters Patent is hereby corrected as shown below:

In the Claims

Column 8, line 44, claim 4 delete "outputting a signal for stopping discharging" and insert --outputting a signal for stopping discharging; or--.

Signed and Sealed this
Thirtieth Day of December, 2014

Michelle K. Lee
*Deputy Director of the United States Patent and Trademark Office*